United States Patent
Donkers et al.

(10) Patent No.: US 7,932,156 B2
(45) Date of Patent: Apr. 26, 2011

(54) BIPOLAR TRANSISTOR HAVING A SECOND, BASE-COMPRISING REGION CONSISTING OF A FIRST LAYER, A SECOND, CONSTRICTIVE, LAYER, AND A THIRD LAYER

(75) Inventors: Johannes J. T. M. Donkers, Valkenswaard (NL); Wibo D. Van Noort, Wappingers Falls, NY (US); Francois Neuilly, Colomby-sur-Thaon (FR)

(73) Assignee: NXP B.V., Eindhoven (NL)

( * ) Notice: Subject to any disclaimer, the term of this patent is extended or adjusted under 35 U.S.C. 154(b) by 323 days.

(21) Appl. No.: 11/997,231

(22) PCT Filed: Jul. 26, 2006

(86) PCT No.: PCT/IB2006/052559
§ 371 (c)(1),
(2), (4) Date: Oct. 24, 2008

(87) PCT Pub. No.: WO2007/015194
PCT Pub. Date: Feb. 8, 2007

(65) Prior Publication Data
US 2009/0174034 A1 Jul. 9, 2009

(30) Foreign Application Priority Data
Aug. 3, 2005 (EP) .................................. 05107147

(51) Int. Cl.
*H01L 21/331* (2006.01)
(52) U.S. Cl. ............................. 438/336; 257/E29.035
(58) Field of Classification Search ................... 257/565, 257/588, E29.035, E29.044, E29.193; 438/312, 438/336
See application file for complete search history.

(56) References Cited

U.S. PATENT DOCUMENTS

| | | | |
|---|---|---|---|
| 5,399,511 A | 3/1995 | Taka et al. | |
| 5,439,832 A | 8/1995 | Nakamura | |
| 7,064,417 B2 | 6/2006 | Arai | |
| 7,271,046 B2 | 9/2007 | Arai | |
| 2001/0039100 A1 | 11/2001 | Gonzalez et al. | |
| 2002/0003286 A1* | 1/2002 | Marty et al. | ........... 257/565 |
| 2003/0098465 A1 | 5/2003 | Suzumura et al. | |
| 2004/0214355 A1 | 10/2004 | Miura et al. | |
| 2004/0224461 A1 | 11/2004 | Dunn et al. | |
| 2004/0262713 A1 | 12/2004 | Joseph et al. | |

FOREIGN PATENT DOCUMENTS
CN 1565060 A 1/2005

* cited by examiner

*Primary Examiner* — Thomas L Dickey

(57) ABSTRACT

The invention relates to a semiconductor device (10) with a substrate (12) and a semiconductor body (11) of silicon comprising a bipolar transistor with an emitter region, a base region and a collector region (1,2,3) first conductivity type, a second conductivity type opposite to said first conductivity type and the first conductivity type, respectively, with a first semiconductor region (3) comprising the collector region or the emitter region being formed in the semiconductor body (11), on top of which a second semiconductor region (2) comprising the base region is present, on top of which a third semiconductor region (1) comprising the other of said collector region and said emitter region is present, said semiconductor body (11) being provided with a constriction at the location of the transition between the first and the second semiconductor region (3, 2), which constriction has been formed by means of an electrically insulating region (26, 27) buried in the semiconductor body (11). According to the invention a part of the semiconductor body that is formed above the buried electrically insulating region (26,27) is monocrystalline. This enables a strong lateral miniaturization of the device and results in excellent high frequency properties of the transistor. Such a device (10) is possible thanks to its manufacture with a method of manufacturing according to the invention.

6 Claims, 3 Drawing Sheets

Figure 1:
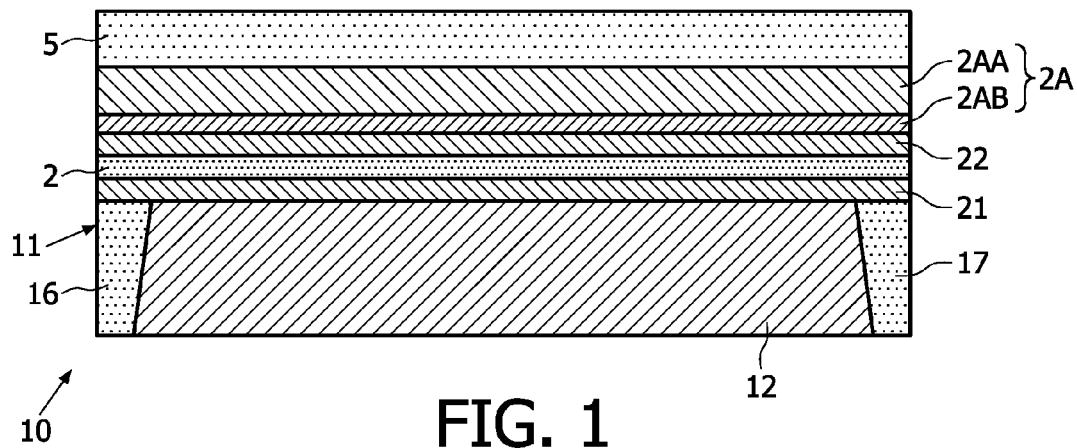

BIPOLAR TRANSISTOR HAVING A SECOND, BASE-COMPRISING REGION CONSISTING OF A FIRST LAYER, A SECOND, CONSTRICTIVE, LAYER, AND A THIRD LAYER

The invention relates to a semiconductor device with a substrate and a semiconductor body of silicon comprising a bipolar transistor with an emitter region, a base region and a collector region of a first conductivity type, a second conductivity type opposite to the first conductivity type and said first conductivity type, respectively, with a first semiconductor region comprising the collector region or the emitter region being formed in the semiconductor body, on top of which a layered second semiconductor region comprising the base region is present, on top of which a third semiconductor region comprising the other of said collector region and said emitter region is present, said semiconductor body being provided with a constriction at the location of the transition between the first and the second semiconductor region, which constriction has been formed by means of an electrically insulating region buried in the semiconductor body. The invention further relates to a method of manufacturing such a device.

Such a device and method are known from US patent US 2004/0224461. Said document describes an npn-type bipolar transistor. A mesa-shaped emitter region of the transistor is present on top of a layered base region of the transistor, and a collector region of the transistor is present there under. The junction between the base region and the collector region is surrounded by an electrically insulating region which is buried under the base region and which forms a local constriction of the semiconductor body.

A drawback of this known device is that it does not lend itself, or least not very well, for further and further lateral miniaturization. On the one hand the possible integration density of the known transistor is limited in this manner, but in addition to that the properties of the transistor, such as the high frequency behavior, are capable of improvement yet. An example of a very high frequency application is a car radar system.

Consequently it is the object of the present invention to provide a device which is suitable for the aforesaid applications, because of its excellent high frequency properties, and wherein lateral miniaturization can be realized without difficulty.

In order to achieve that object, a device of the kind referred to in the introduction is characterized in that a part of the semiconductor body that is formed above the buried electrically insulating region is monocrystalline. The invention is in the first place based on the perception that in the known device, in which the base region is formed by epitaxy, parts thereof are formed on top of the electrically insulating region, thus burying said region. The parts thus formed are polycrystalline, whilst an adjacent part—above the collector region—is monocrystalline. The invention is furthermore based on the perception that the thus resulting transition between monocrystalline silicon and polycrystalline silicon renders lateral miniaturization of the transistor in the known device difficult or even impossible. By making the region of the semiconductor body above the buried electrically insulating region monocrystalline, the device according to the invention can be designed to have very small lateral dimensions and to exhibit an excellent high frequency behavior, therefore. The invention is based on the surprising perception that when a manufacturing method according to the invention is used, the part of the semiconductor body that is present above the buried electrically insulating region can be made monocrystalline in spite of being formed by epitaxy.

Briefly put, this is achieved by first forming an SiGe region at the location of the buried electrically insulating region, on top of which region part of the semiconductor body is deposited by epitaxy. Providing the SiGe is not too high in combination with a thickness thereof that remains within bounds, the aforesaid epitaxy leads to a monocrystalline deposition. Following that—seen in projection from the outside to the inside—part of the SiGe region is removed by selective etching, after which a buried electrically insulating region is formed in the cavity thus created.

In a preferred embodiment of a method according to the invention, the base region is provided with at least one electrical connection positioned above the buried electrically insulating region. Because of the fact that the base region is now monocrystalline at that location, a reduction of the lateral dimensions is possible, whilst the resistance of the base region can be very low.

Preferably, the constriction of the semiconductor body is located in the base region. The advantage of this is that the SiGe region that is used for the formation of the constriction is also located in the base region. The part of the SiGe region that remains after said formation is very advantageous with regard to the properties of the transistor, such as the speed thereof.

Since the part of the base region above the electrically insulating region is relatively thin in the latter variant, the thickness of the second semiconductor region, which has a layered structure, is—inter alia in that case—preferably greater on both sides of the third semiconductor region, which is mesa-shaped, than under the third semiconductor region. The base region above the buried electrically insulating region can easily be formed with a greater thickness, for example by selective epitaxy.

In a very advantageous embodiment, the semiconductor body comprises a further sunken or buried electrically insulating region which, seen in projection, is spaced from the third semiconductor region by a larger distance than the buried electrically insulating region. A usual insulating region can be used for this purpose, such as an STI (=Shallow Trench Isolation) region or a LOCOS (=Local Oxidation Of Silicon) region. This renders the manufacture of the device according to the invention highly compatible with usual processes. In addition to that, said further sunken or buried electrically insulating region provides a possibility of further optimization of the properties of the transistor in the device according to the invention.

Thus, the capacitance between the base region and the collector region can be further reduced by forming said further sunken or buried electrically insulating region with a greater thickness than the buried electrically insulating region, which has a positive effect on the high frequency properties. Furthermore, a reduced current spread in the collector region is achieved in this manner.

It is noted in this connection that when the emitter region and the collector region exchange roles in a conventional bipolar transistor, the transistor is called an inverted transistor. In the device according to the invention, too, the emitter region may be positioned under the base region in a corresponding manner. After all, both regions have relatively small lateral dimensions.

With a device according to the invention, such an exchange leads to a significant improvement of the cutoff frequency ($f_T$) of the transistor, because the forward base collector storage capacitance strongly decreases, as even a very thin oxide layer deposited in a cavity formed in an SiGe layer will block the injection of charge carriers.

Preferably, however, the first semiconductor region comprises the collector region and the third semiconductor region comprises the emitter region. In an advantageous variant thereof the base region, and preferably also the collector region, is provided with a double electrical connection on either side of the emitter region.

According to the invention, a method of manufacturing a semiconductor device with a substrate and a semiconductor body of silicon which is provided with a bipolar transistor with an emitter region, a base region and a collector region of a first conductivity type, a second conductivity type opposite to the first conductivity type and said first conductivity type, respectively, wherein a first semiconductor region comprising the collector region or the emitter region is formed in the semiconductor body, on top of which a second semiconductor region comprising the base region is formed, on top of which a third semiconductor region comprising the other of said collector region and said emitter region is formed, wherein said semiconductor body is provided with a constriction at the location of the transition between the first and the second semiconductor region, which constriction is formed by means of a buried electrically insulating region that is formed in the semiconductor body, is characterized in that a part of the semiconductor body that is present above the buried electrically insulating region is formed in such a manner that it is monocrystalline. In this way a device according to the invention is obtained.

In a preferred embodiment of a method according to the invention, a region of a mixed crystal of silicon and germanium is formed at the location of the buried electrically insulating region that is to be formed, which region is removed by selective etching, after which the cavity thus formed is filled with an electrically insulating material. Air or a gas may be used as the electrically insulating material, but preferably the cavity that has been created is filled with a dielectric, such as silicon dioxide. This can be formed by means of a CVD (=Chemical Vapor Deposition) process, but preferably by means of a thermal oxidation process.

As already noted in the discussion of the device according to the invention, the part of the semiconductor body above the buried electrically insulating region is formed by epitaxy on top of the region that is formed as a mixed crystal of silicon and germanium to enable removal thereof. The electrical connection(s) of the base region is (are) preferably formed above the buried electrically insulating region.

Preferably, the second semiconductor region is formed with a greater thickness on either side of the third semiconductor region, preferably by selective epitaxy, than under the third semiconductor region. The SiGe region is preferably formed in the form of an SiGe epitaxial layer. If said layer is formed as part of the base region, the remaining part of said SiGe layer will contribute to the properties of the transistor.

The thickness of the buried electrically insulating region can be increased by carrying out a further etching step after selective etching of part of the SiGe layer, for example using an etchant of silicon which is selective to SiGe. The advantage of this is that the lateral dimensions of the remaining part of the SiGe layer are not changed by said step. In principle, the etching of the SiGe layer itself must take place in time. If desired, a lateral etch stop may be incorporated in the SiGe layer, for example by incorporating a lateral pn-junction.

Figure 2:
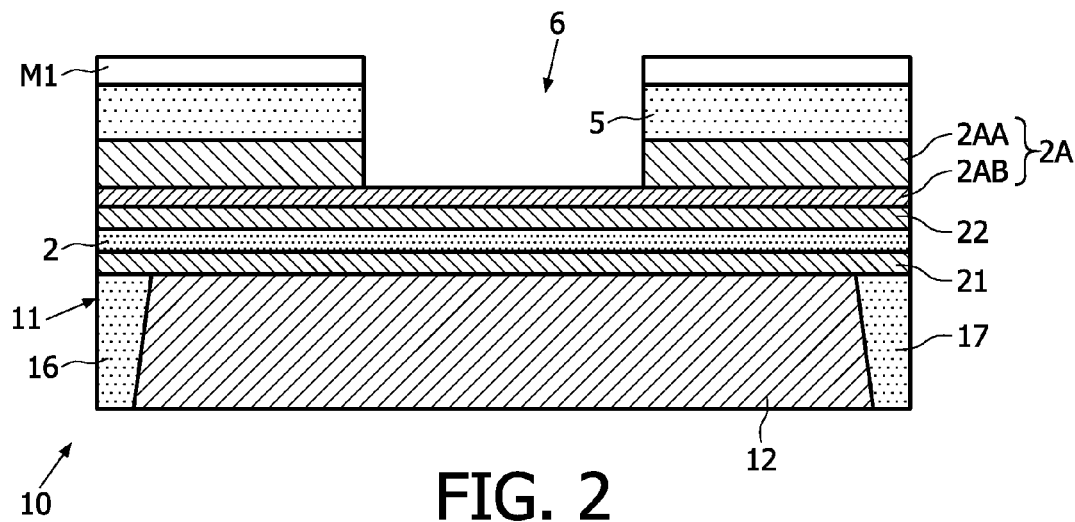
Figure 3:
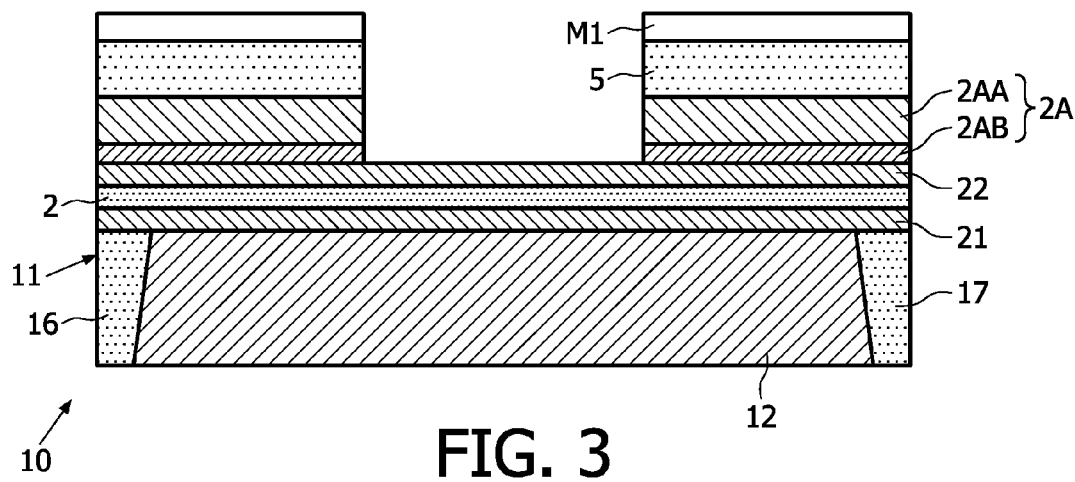
Figure 4:
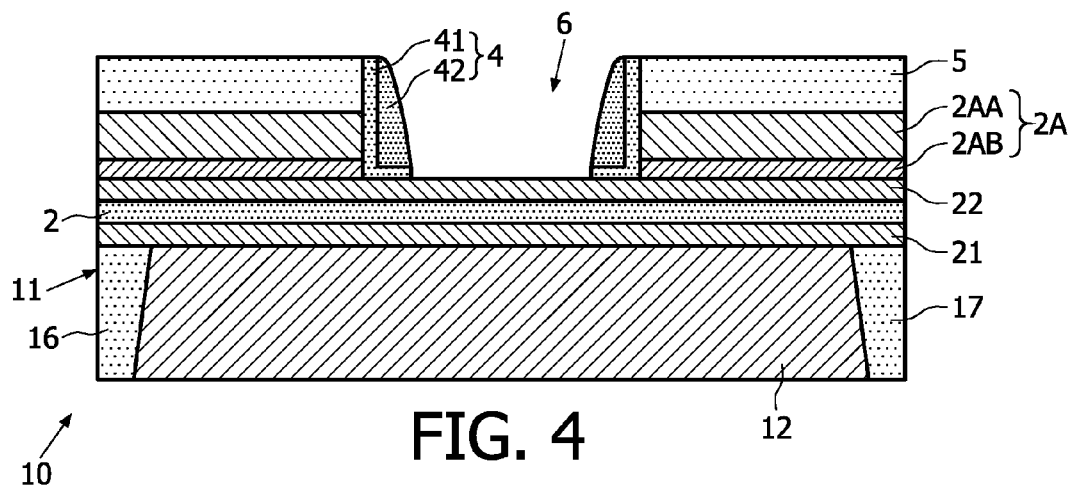
Figure 5:
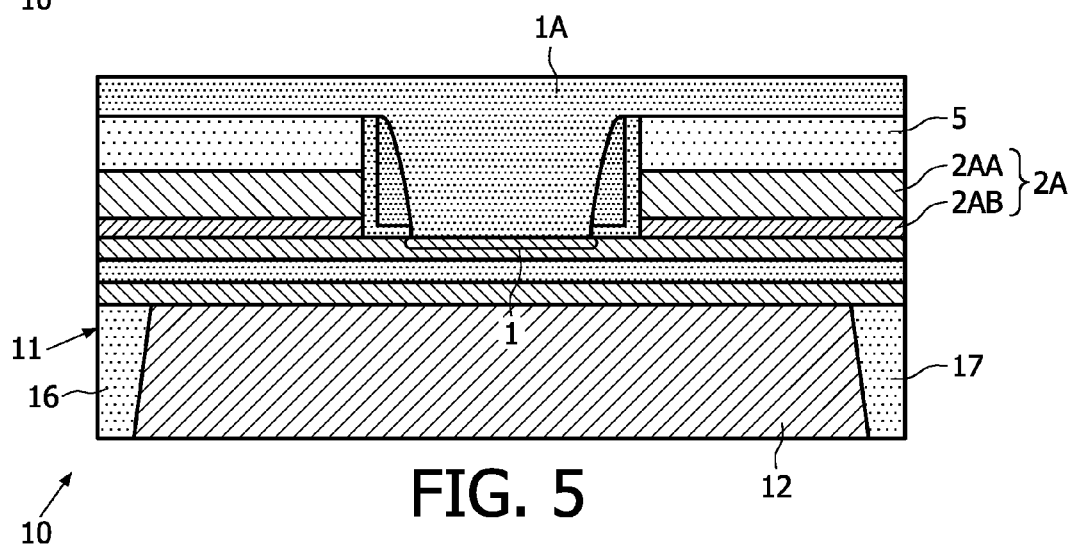
Figure 6:
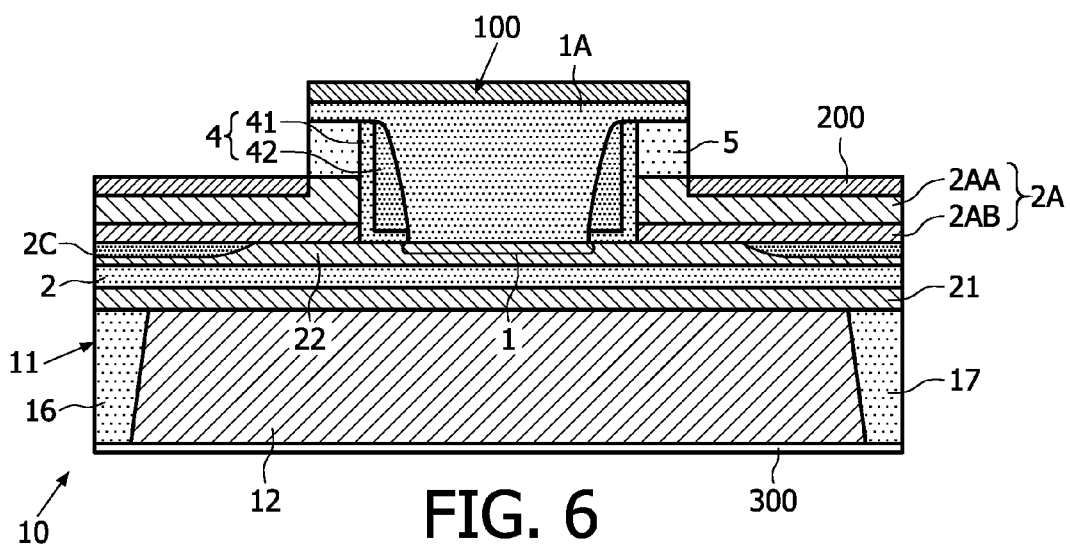
Figure 7:
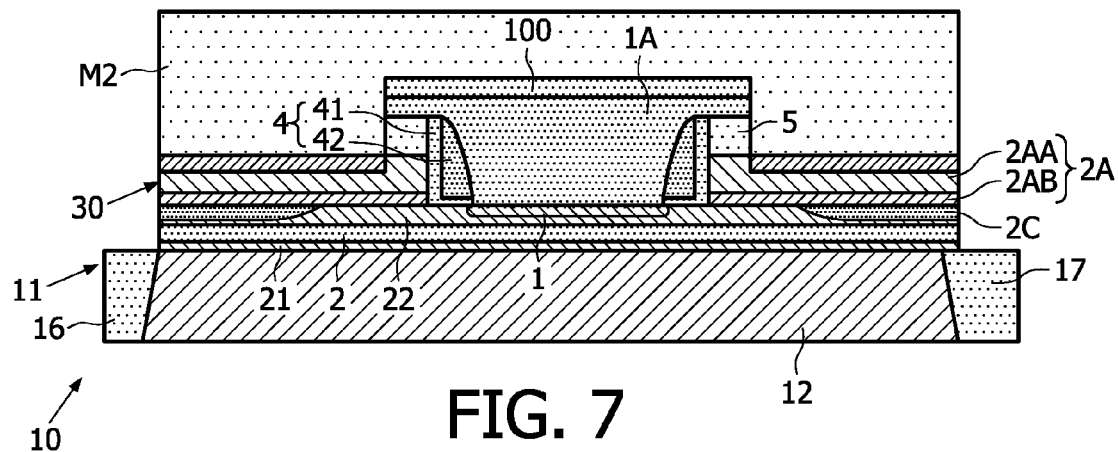
Figure 8:
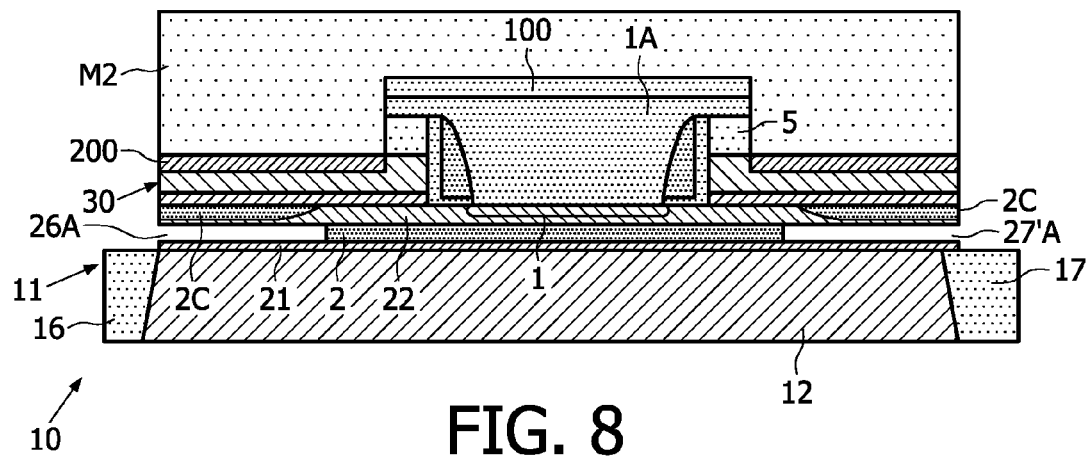
Figure 9:
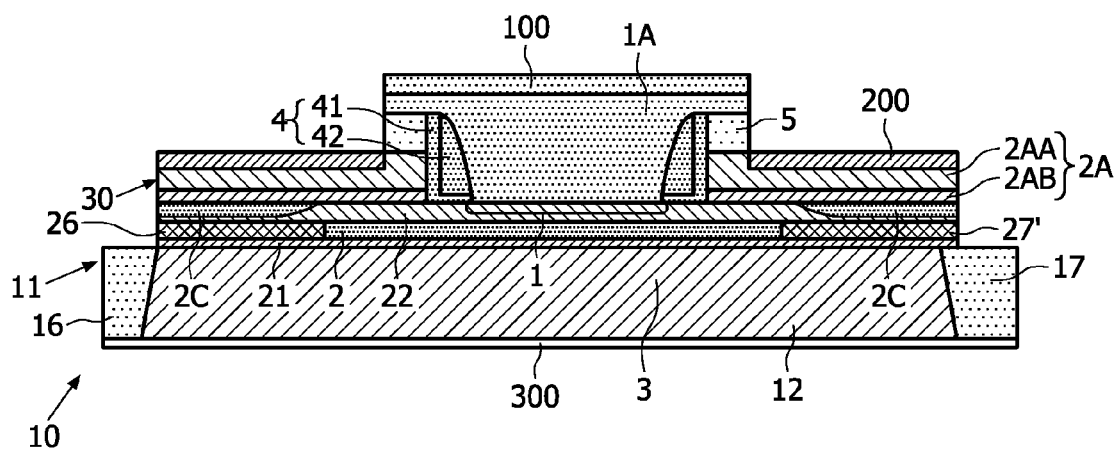

The invention will now be explained in more detail with reference to an embodiment and the drawing, in which:

FIGS. 1-9 are schematic, cross-sectional views perpendicular to the thickness direction of a device according to the invention, showing successive stages of the manufacture thereof by means of a method according to the invention.

The Figures are not drawn to scale, and some dimensions are exaggerated for the sake of clarity. Like regions or parts are indicated by the same numerals as much as possible.

FIGS. 1-9 are schematic, cross-sectional views perpendicular to the thickness direction of a device according to the invention, showing successive stages of the manufacture thereof by means of a method according to the invention. The—at least substantially complete—device 10 (see FIG. 9) of this example comprises a semiconductor body 11 with, in this case, an n-type silicon substrate 12 and a semiconductor layer structure provided thereon and a bipolar transistor. The discrete (in this example) transistor has an n-type emitter region 1, a p-type base region 2 and an n-type collector region 3, which are provided with a first, a second and a third connection conductor 100, 200, 300, respectively. The base region 2 comprises a mixed crystal of silicon and germanium having a germanium content of 20 at. % and, in this example, a doping concentration in the range of $1\times10^{19}$ at/cm$^3$ to $1\times10^{20}$ at/cm$^3$. Layered regions 21, 22 are positioned on either side of the base region, seen in the thickness direction, which regions function as transition layers and which have a lower doping concentration, for example in the range of $1\times10^{17}$ at/cm$^3$ to $1\times10^{19}$ at/cm$^3$. The emitter region 1 has been formed in the n-type transition layer 22 by outdiffusion. The collector 3 and the emitter 1 comprise silicon in this case. The collector 3 comprises, in this case, the n-type (or intrinsic) transition layer 21 and part of the substrate 12, it may furthermore, unlike the present example, be built up of a lowly doped part, the so-termed drift region, and a highly doped part that is positioned adjacent to the substrate or forms part thereof. The connection conductors 100, 200 of the emitter region 1 and the base region 2 comprise a silicide in this case, for example nickel or cobalt silicide, whilst the connection conductor 300 of the collector region 3 comprises aluminum in this case. The emitter connection region 1A comprises a polycrystalline silicon region in this example, and is (electrically) isolated from the base connection region 2A by means of spacers 4.

The semiconductor body 11 is provided with a constriction, in this case at the location of the base region 2, which has been formed between electrically insulating regions 26, 27 buried in the semiconductor body. Said electrically insulating regions comprise silicon dioxide in this case, they extend from the side walls of a mesa-shaped part 30 of the semiconductor body 11 in the direction of the base region 2 and have the same thickness as the region 2 in this case. According to the invention, a part of the semiconductor body 11 that is present above the regions 26, 27 is monocrystalline. This makes it possible for the device 10 to have very small lateral dimensions and very good high frequency properties. All this can be achieved by manufacturing the device by means of a method according to the invention. With the known manufacturing method, the aforesaid part of the semiconductor body 11 is polycrystalline or even amorphous.

The base connection region 2A comprises a polycrystalline silicon conductive region 2AA in this example, and an underlying further conductive region 2AB, of tantalum nitride in this example, relative to which the polycrystalline silicon region 2AA can be selectively etched. The emitter connection region 1A is T-shaped (seen in cross-sectional view) in this example, with the arms of the T extending over an insulating region 5 present on top of the polycrystalline silicon region 2AA. Furthermore, the device 10 comprises partially sunken and partially buried further insulating regions 16, 17, which comprise silicon dioxide in this case and which have a greater thickness and are spaced from the emitter region 1 by a larger distance than the buried electrically insulating regions 26, 27.

The lateral dimensions of the device 10 of this example are 1 μm×10 μm. The emitter region 1 has a doping concentration of about $10^{20}$ at/cm$^3$ and a thickness of about 10 nm. The base region 2 has a thickness of about 20 nm, as have the adjacent transition layers 21, 22. The device 10 of this example is manufactured as follows, for example, by means of a method according to the invention.

The starting point (see FIG. 1) is an n-type silicon substrate 12, in which so-termed STI (=Shallow Trench Isolation) regions 16, 17 are formed in this example. An underlying part of the substrate 12 has been left out of the drawing for the sake of simplicity. P-type layers 21, 2, 22 are first deposited thereon by epitaxy, with the center layer being formed of SiGe and the outer two layers being formed of Si. Doping concentrations and thicknesses are selected as indicated above. Then a further layer structure is provided, for example in another deposition device, which structure comprises, successively, a conductive layer 2AB of tantalum nitride, a polycrystalline, highly doped silicon layer 2AA and an insulating layer 5 of silicon dioxide. Preferably, sputtering or MOCVD (=Metal Organic Chemical Vapor Depostion) is used as the deposition technique, for example for depositing the conductive layer 2AB in this example, whilst the polycrystalline silicon layer 2AA and the insulating layer are formed by CVD (=Chemical Vapour Deposition), with the thicknesses of said layer being 10 nm, 100 nm and 50 nm, respectively.

Subsequently (see FIG. 2) an opening 6 is etched in the insulating layer 5 and in the polycrystalline silicon layer 2AA, using a photolithographic mask M1. This can be done by means of a dry etching process, for example. In said process, the tantalum nitride layer 2AB functions as an etch stop layer.

Following that (see FIG. 3) a part of the tantalum nitride layer 2AB defined by M1 is selectively etched away with respect to the silicon layer 22 by means of a further etching process, for example a dry or a wet chemical etching process.

After removal of the mask M1 (see FIG. 4), spacers 4 are formed in the opening 6, which spacers are built up, in this example, of two thin layers 41, 42 of silicon dioxide and silicon nitride having a thickness of 10 and 50 to 100 nm. The layers are uniformly applied and subsequently the flat portions thereof are removed by means of an anisotropic etching process.

Following this (see FIG. 5) the opening 6 is filled with an n-type polycrystalline silicon layer 1A. Said layer is formed by means of a CVD process. By subjecting the resulting structure to a heat treatment, an emitter region 1 is formed by local overdoping as a result of outdiffusion of the n-type contaminations in the emitter connection region 1A in the transition layer 22.

Then (see FIG. 6) the emitter connection region 1A is patterned by photolithography and etching whilst retaining the T-shaped cross-section. The width of the T at the base is about 200 nm, and the width of the T at the top is about 500 nm. Following this, the highly doped parts 2C of the base region 2 are formed by means of a p-type ion implantation, with the T-shaped connection region 1A functioning as a mask. It is noted that in practice a photoresist mask will still be present on the T-shaped mesa at that stage—contrary to what is shown in the drawing—and that in that case said implantation will take place between the manufacturing stages that are shown FIG. 5 and FIG. 6. On the one hand the photoresist mask protects the emitter connection region 1A against the implantation, and on the other hand the metal silicide layers 100, 200 can be formed in one step after removal of said mask.

Then the connection conductors 100, 200 are formed, for example, by depositing a metal layer of nickel or cobalt, which is converted into nickel or cobalt silicides 100, 200 by silicization. In this example, the rear side of the substrate 12 is contacted with aluminum, thus forming the connection conductor 300 of the collector region 3. The collector region 3 can also be advantageously contacted with the upper surface of the semiconductor body 11 via a sunken connection region and a connection conductor.

Following this (see FIG. 7) a mask M2, in this case of photoresist, is applied to the device 10, after which the semiconductor body 11 is provided with a mesa-shaped part 30 located on the surface, in this case by means of a dry etching process.

Subsequently (see FIG. 8), part of the layer 2 that forms the base region 2 is removed from the side wall of the mesa-shaped part 30 of the semiconductor body 11 by means of a selective—wet or dry—chemical etching process. A cavity 26A, 27A is thereby formed adjacent to the Si-containing layers 21, 22 and to the remaining part of the SiGe layer 2 that forms the base region 2.

In this example (see FIG. 9), the cavity thus formed is converted into the buried electrically insulating regions 26, 27 by filling the cavity with an electrically insulating material, silicon dioxide in this case. Especially if the cavity is not very thick, it can also be filled by thermal oxidation at a low temperature. If desired, the forming of the mesa-shaped part 30 and the cavity 26A, 27A can to that end be carried out at an earlier stage of the manufacture so as to prevent the connection conductors 100, 200, 300 from being damaged.

After a separation technique such as sawing or etching has been carried out, individual devices 10 according to the invention can be obtained.

The invention is not limited to the embodiments as discussed herein, as many variations and modifications are possible to those skilled in the art within the scope of the invention. Thus, in addition to being suitable for use in a discrete semiconductor device, the invention is also very suitable for use in an integrated semiconductor device, such as a (BI) CMOS (=(Bipolar) Complementary Metal Oxide Semiconductor) IC (=Integrated Circuit). In fact, the structure and the manufacture of the transistor as described in the examples is quite suitable for use in an IC.

Furthermore it is noted that instead of using STI isolation regions it is also possible to use isolation regions that have been obtained by means of the LOCOS (=Local Oxidation Of Silicon) technique. Besides SiGe, it is also possible to use other materials which can be selectively etched and on which silicon monocrystalline can be grown. An example of such a material is SiC. In addition to that, silicon may also be provided with contaminations which hardly affect the lattice constant of silicon but which nevertheless enable selective etching. Thus, n-type silicon can be selectively etched with respect to p-type silicon, for example, or vice versa. Furthermore, an electrically non-active dopant may influence the etchability of silicon to a sufficient extent.

Many variants and modifications are possible also with regard to a method according to the invention. Thus, the SiGe layer or an SiGe region can also be formed by implanting germanium in a silicon region.

The invention claimed is:

1. A method of manufacturing a semiconductor device with a substrate and a semiconductor body of silicon which is provided with a bipolar transistor with an emitter region, a base region and a collector region of a first conductivity type, a second conductivity type opposite to the first conductivity type and said first conductivity type, respectively, the method comprising:

forming a first semiconductor region including the collector region or the emitter region in the semiconductor body, forming, on top of the first semiconductor region, a second semiconductor region including the base region, forming, on top of the second semiconductor region, a third semiconductor region including the other of said collector region and said emitter region, providing said semiconductor body with a constriction at the location of the transition between the first and the second semiconductor region, forming said constriction by means of a buried electrically insulating region that is formed in the semiconductor body, characterized in that a part of the semiconductor body that is present above the buried electrically insulating region is formed in such a manner that it is monocrystalline, and forming a region of a mixed crystal of silicon and germanium at the location of the buried electrically insulating region that is to be formed, selectively etching the region, and filling a cavity formed by the selective etching with an electrically insulating material.

2. A method as claimed in claim 1, characterized in that the part of the semiconductor body above the buried electrically insulating region is formed by epitaxy on top of the region that is formed as a mixed crystal of silicon and germanium to enable removal thereof.

3. A method as claimed in claim 2, characterized in that the region of the mixed crystal of silicon and germanium is formed as part of a SiGe containing epitaxial layer.

4. A method as claimed in claim 3, characterized in that said SiGe containing layer is formed in the second semiconductor region.

5. A semiconductor device with a substrate and a semiconductor body of silicon, the device comprising: a bipolar transistor with an emitter region, a base region and a collector region of a first conductivity type, a second conductivity type opposite to said first conductivity type and the first conductivity type, respectively, with a first semiconductor region comprising the collector region or the emitter region being formed in the semiconductor body, on top of which a second semiconductor region by comprising the base region is present, on top of which a third semiconductor region comprising the other of said collector region and said emitter region is present, said semiconductor body being provided with a constriction at the location of the transition between the first and the second semiconductor region, which constriction has been formed by means including an electrically insulating region buried in the semiconductor body, with a part of the semiconductor body that is formed above the buried electrically insulating region is monocrystalline, and with the second semiconductor region consisting of a first, a second and a third layer, and wherein the constriction is located at the second layer.

6. The semiconductor device of claim 5, wherein the first layer is directly above and touching the electrically insulating region forming the constriction in the second layer.

* * * * *